(12) United States Patent
Anderson

(10) Patent No.: US 10,069,007 B2
(45) Date of Patent: Sep. 4, 2018

(54) VERTICAL FETS WITH HIGH DENSITY CAPACITOR

(71) Applicant: International Business Machines Corporation, Armonk, NY (US)

(72) Inventor: Brent A. Anderson, Jericho, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/469,882

(22) Filed: Mar. 27, 2017

(65) Prior Publication Data
US 2017/0294536 A1    Oct. 12, 2017

Related U.S. Application Data

(63) Continuation of application No. 15/096,837, filed on Apr. 12, 2016, now Pat. No. 9,666,578.

(51) Int. Cl.
| | |
|---|---|
| H01L 27/108 | (2006.01) |
| H01L 29/94 | (2006.01) |
| H01L 29/78 | (2006.01) |
| H01L 27/07 | (2006.01) |
| H01L 29/66 | (2006.01) |
| H01L 21/8234 | (2006.01) |

(Continued)

(52) U.S. Cl.
CPC .. *H01L 29/7827* (2013.01); *H01L 21/823487* (2013.01); *H01L 27/0629* (2013.01); *H01L 27/0733* (2013.01); *H01L 28/60* (2013.01); *H01L 29/66666* (2013.01); *H01L 29/7803* (2013.01)

(58) Field of Classification Search
USPC .................................. 257/E27.06, 306, 308
See application file for complete search history.

(56) References Cited

U.S. PATENT DOCUMENTS

| | | | |
|---|---|---|---|
| 7,892,956 B2* | 2/2011 | Deligianni | B82Y 10/00 257/E29.262 |
| 8,637,849 B2* | 1/2014 | Deligianni | B82Y 10/00 257/24 |

(Continued)

OTHER PUBLICATIONS

Fist of IBM Patents or Patent Applications Treated as Related; (Appendix P), Filed Nov. 2, 2017; pp. 1-2.

*Primary Examiner* — Telly Green
(74) *Attorney, Agent, or Firm* — Cantor Colburn LLP; Vazken Alexanian

(57) ABSTRACT

A technique relates to semiconductors. A bottom terminal of a transistor and bottom plate of a capacitor are positioned on the substrate. A spacer is arranged on the bottom terminal of the transistor. A transistor channel region extends vertically from the bottom terminal through the spacer to contact a top terminal of the transistor. A capacitor channel region extends vertically from the bottom plate to contact a top plate of the capacitor. A first gate stack is arranged along sidewalls of the transistor channel region and is in contact with the spacer. A second gate stack is arranged along sidewalls of the capacitor channel region and is disposed on the bottom plate. A distance from a bottom of the first gate stack to a top of the bottom terminal is greater than a distance from a bottom of the second gate stack to a top of the bottom plate.

17 Claims, 12 Drawing Sheets

(51) Int. Cl.
*H01L 27/06* (2006.01)
*H01L 49/02* (2006.01)

(56) References Cited

U.S. PATENT DOCUMENTS

| | | | | |
|---|---|---|---|---|
| 8,735,957 | B2 * | 5/2014 | Rutter | H01L 29/7803 |
| | | | | 257/301 |
| 8,841,185 | B2 * | 9/2014 | Khakifirooz | H01L 27/0805 |
| | | | | 257/308 |
| 9,129,991 | B2 * | 9/2015 | Rutter | H01L 29/7803 |
| 9,406,669 | B2 * | 8/2016 | Chuang | H01L 27/0629 |
| 9,478,536 | B2 * | 10/2016 | Baek | H01L 27/0629 |
| 9,530,700 | B1 * | 12/2016 | Mallela | H01L 27/0924 |
| 9,666,578 | B1 | 5/2017 | Anderson | |
| 2011/0012085 | A1 * | 1/2011 | Deligianni | B82Y 10/00 |
| | | | | 257/9 |
| 2011/0108803 | A1 * | 5/2011 | Deligianni | B82Y 10/00 |
| | | | | 257/24 |
| 2014/0042547 | A1 * | 2/2014 | Khakifirooz | H01L 27/0805 |
| | | | | 257/368 |
| 2014/0252442 | A1 * | 9/2014 | Chuang | H01L 27/0629 |
| | | | | 257/306 |
| 2017/0222021 | A1 * | 8/2017 | Mallela | H01L 29/66545 |
| 2017/0243974 | A1 * | 8/2017 | Mallela | H01L 29/7827 |

* cited by examiner

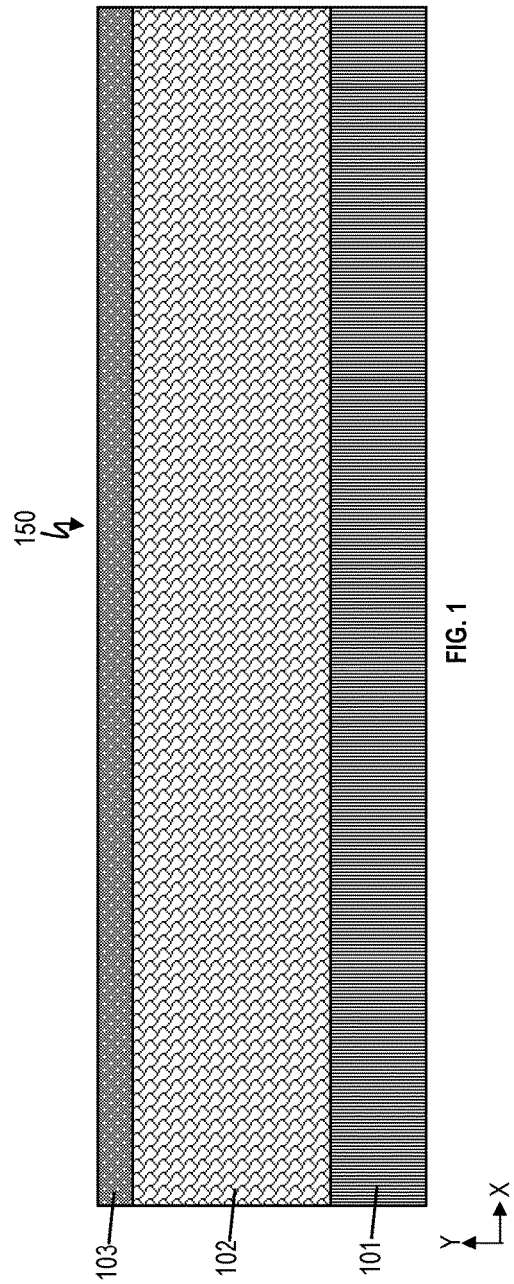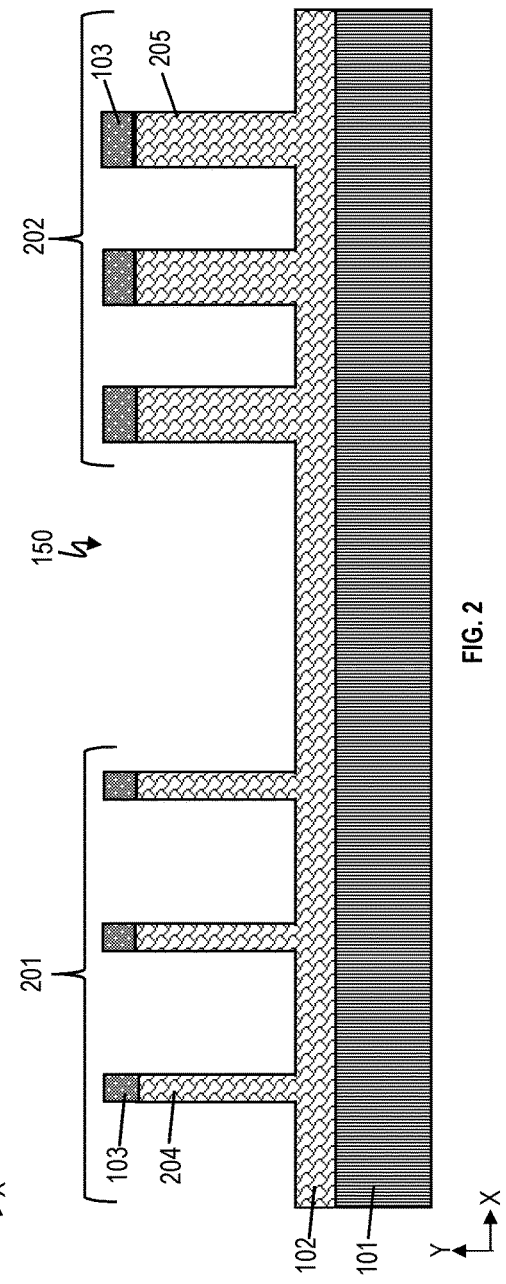

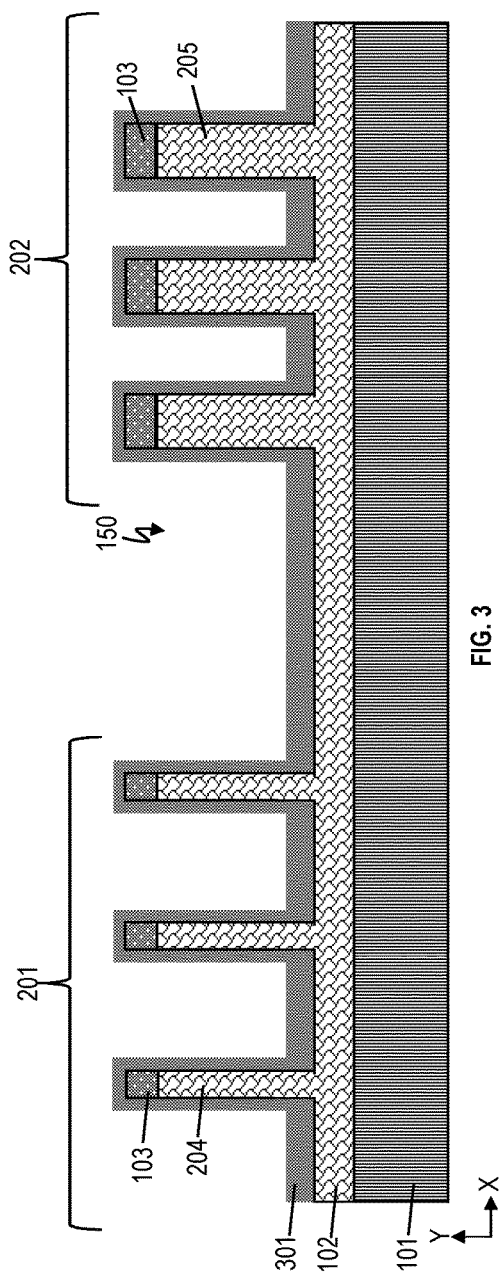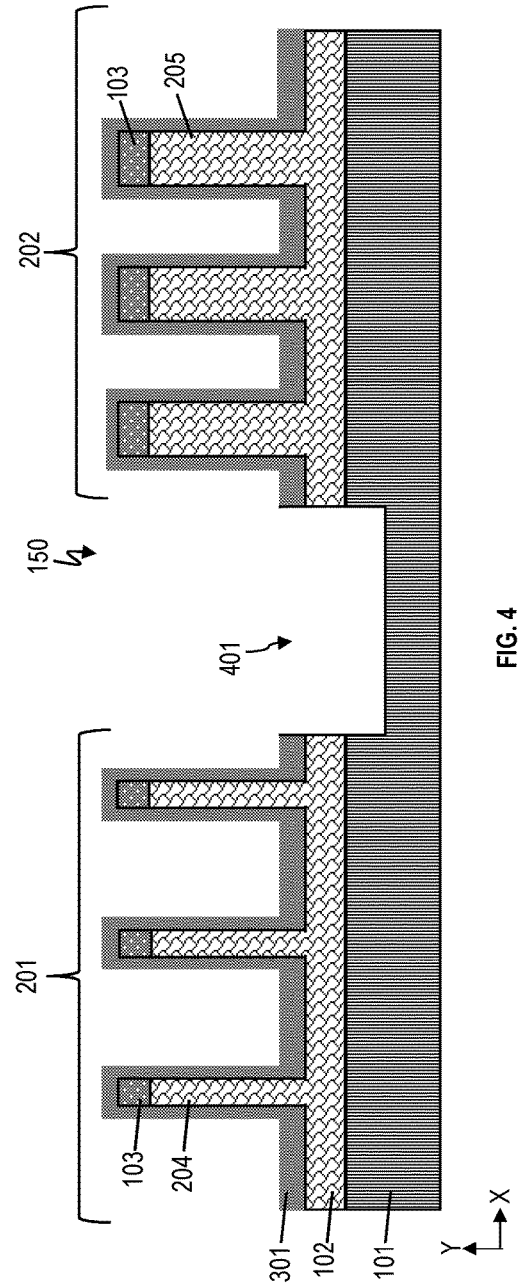

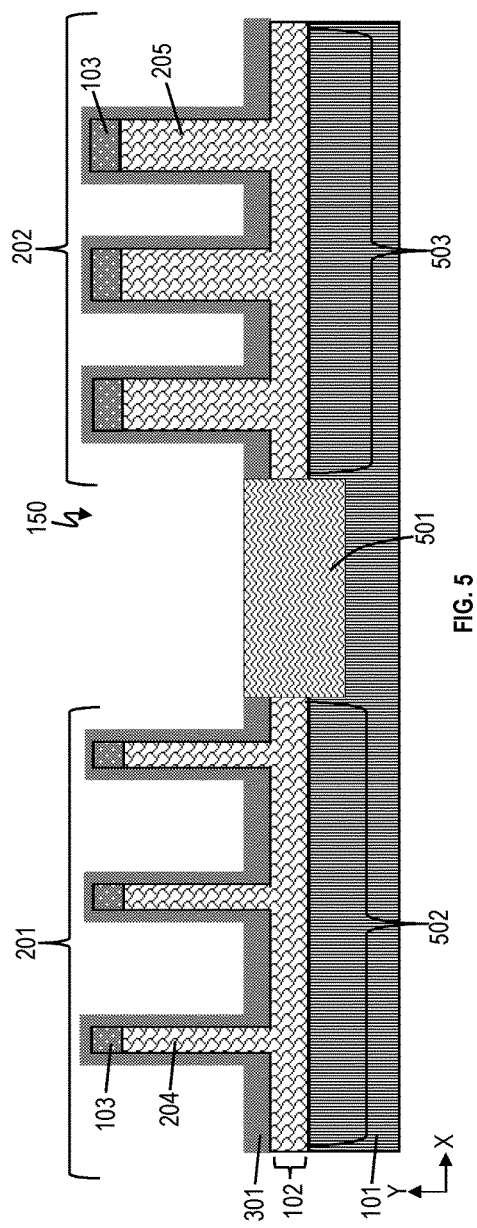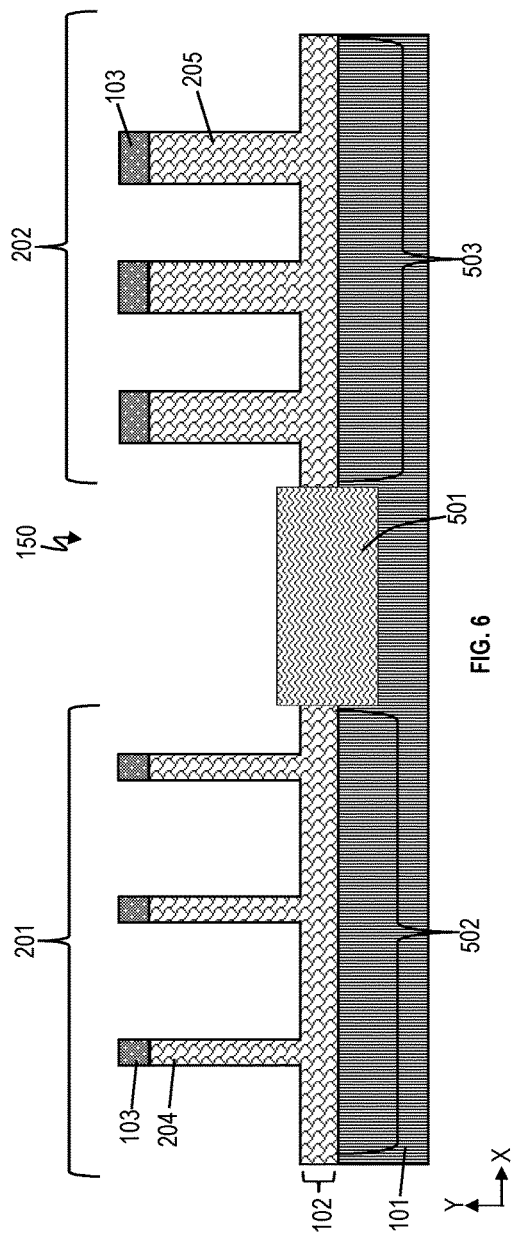
FIG. 5
FIG. 6

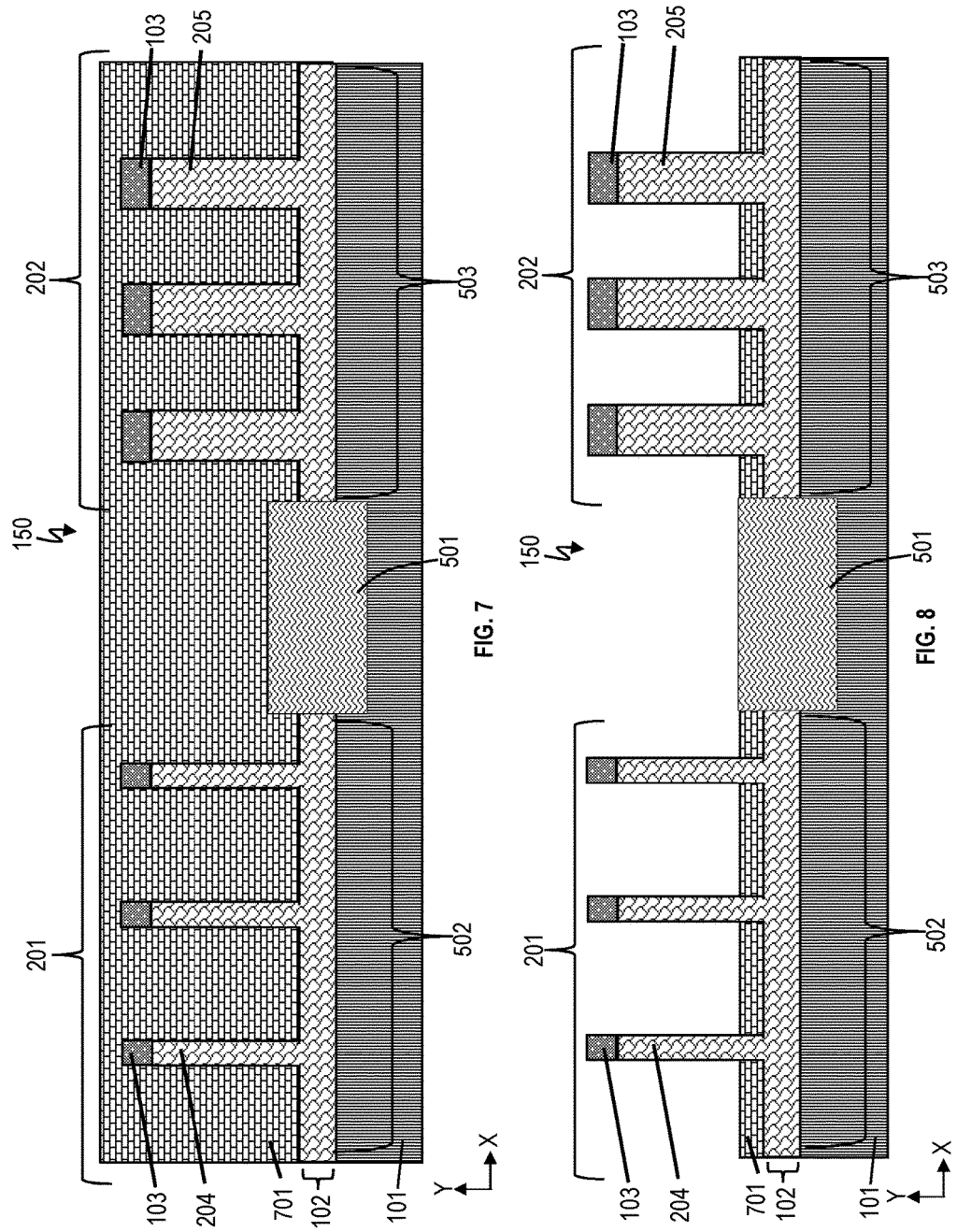

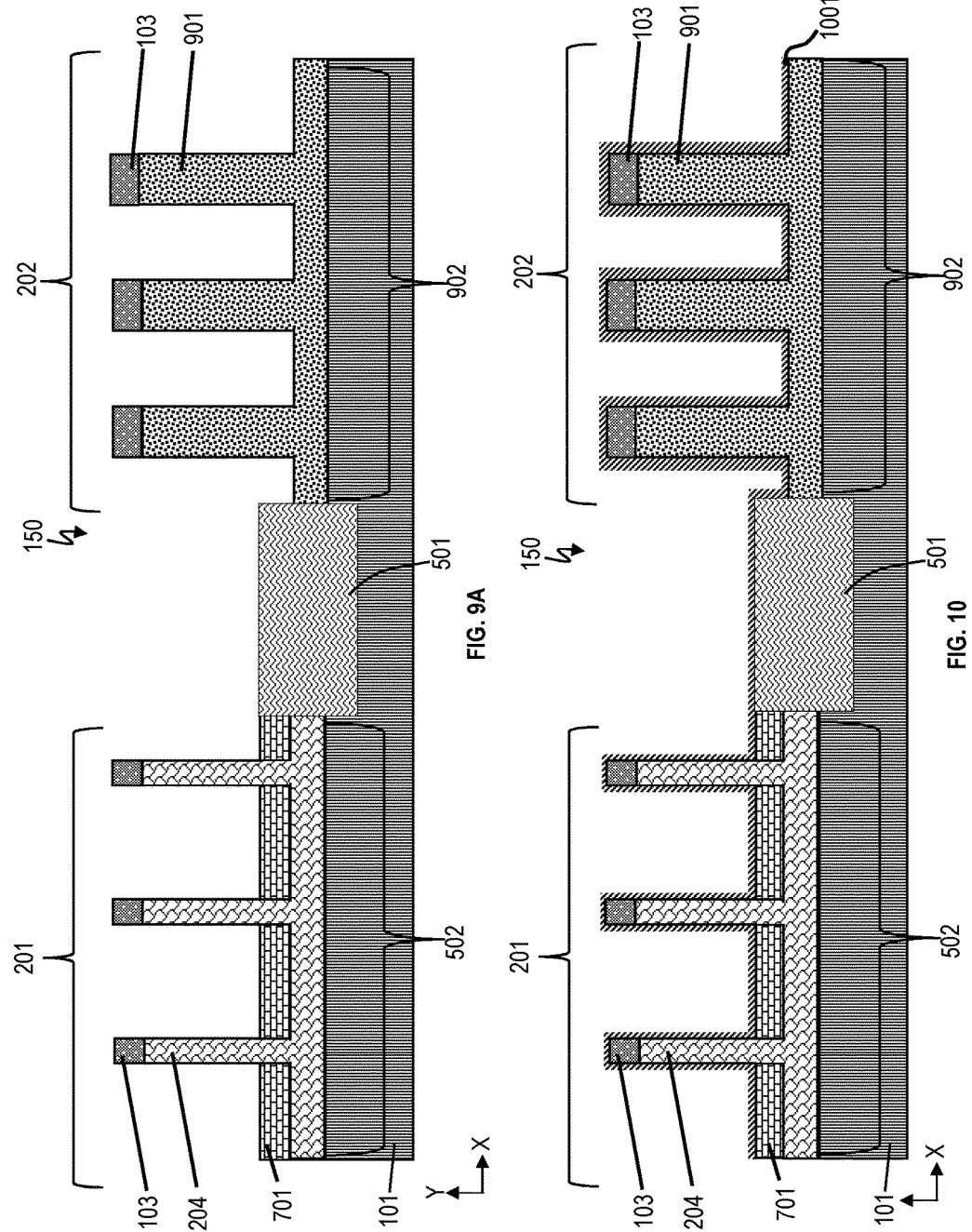

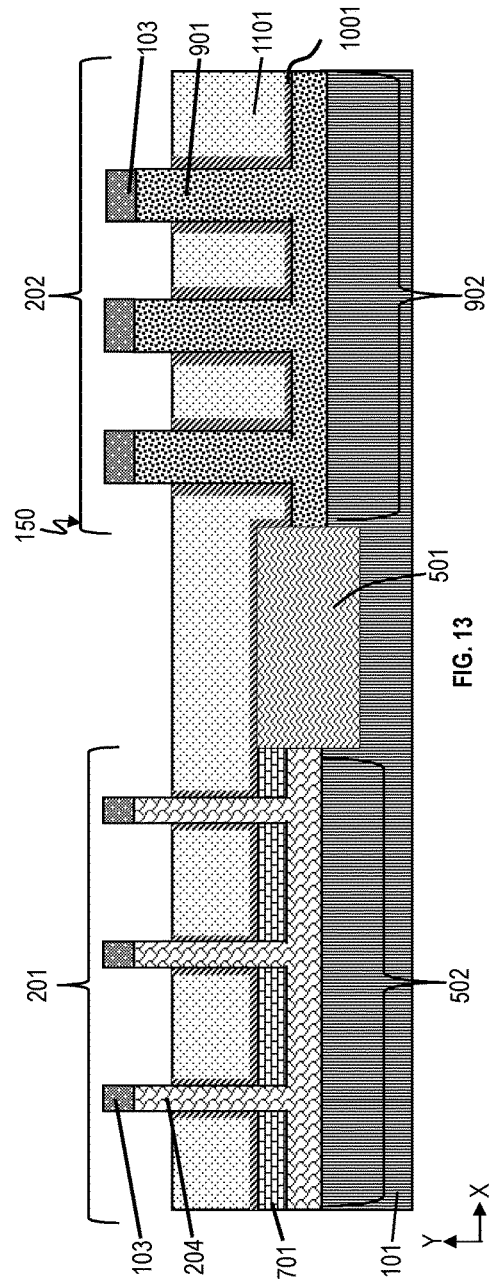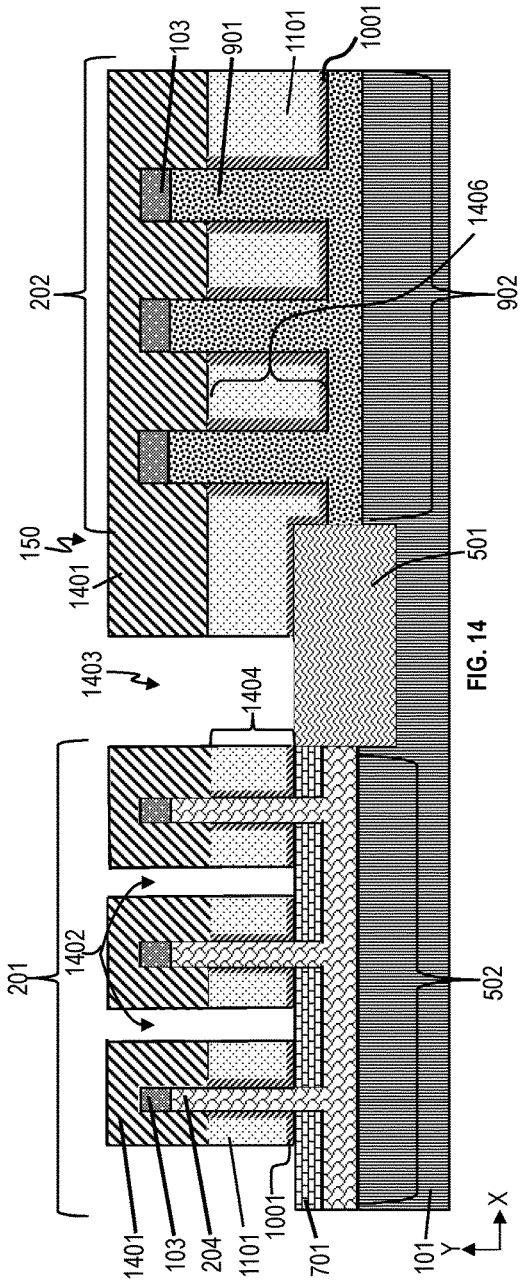

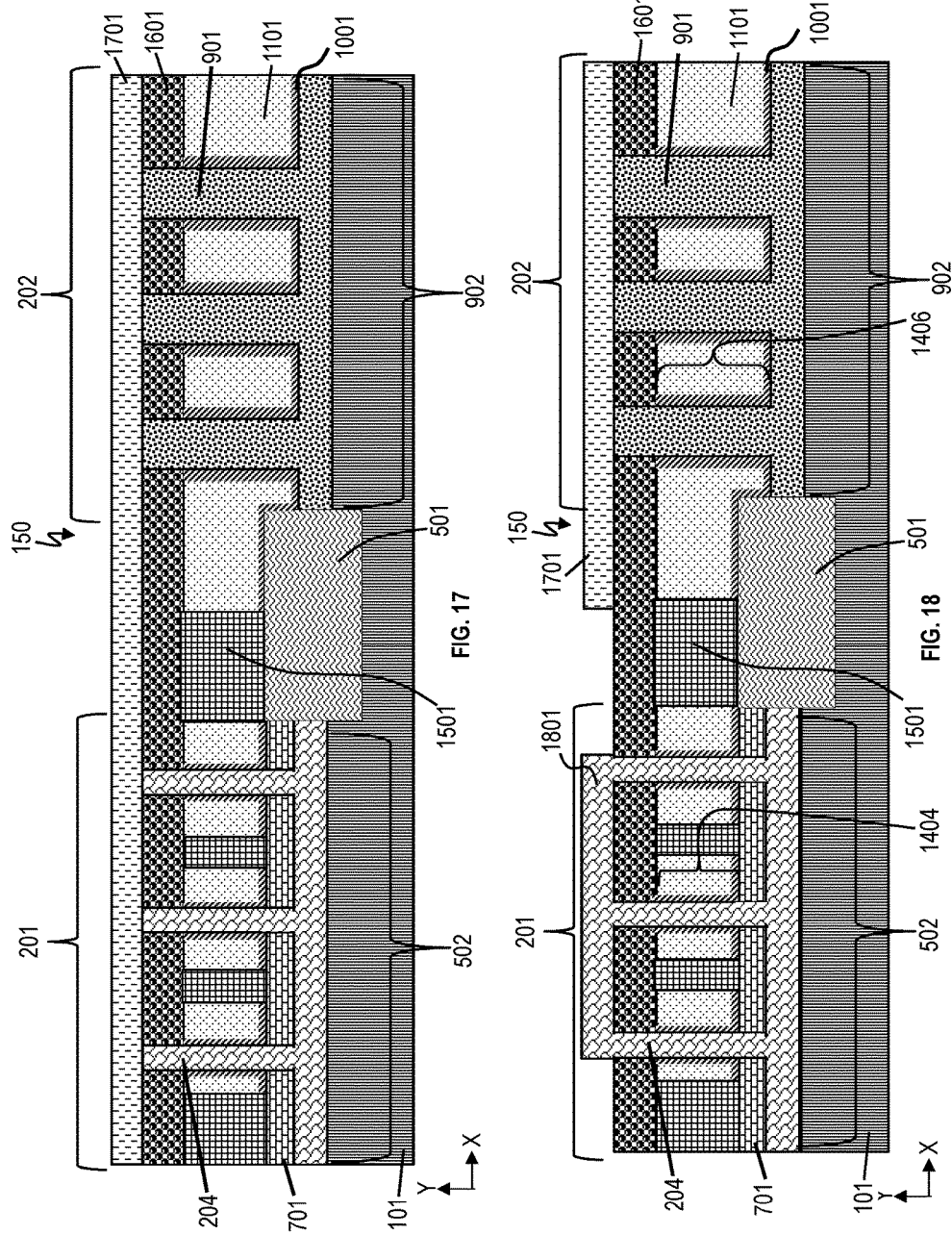

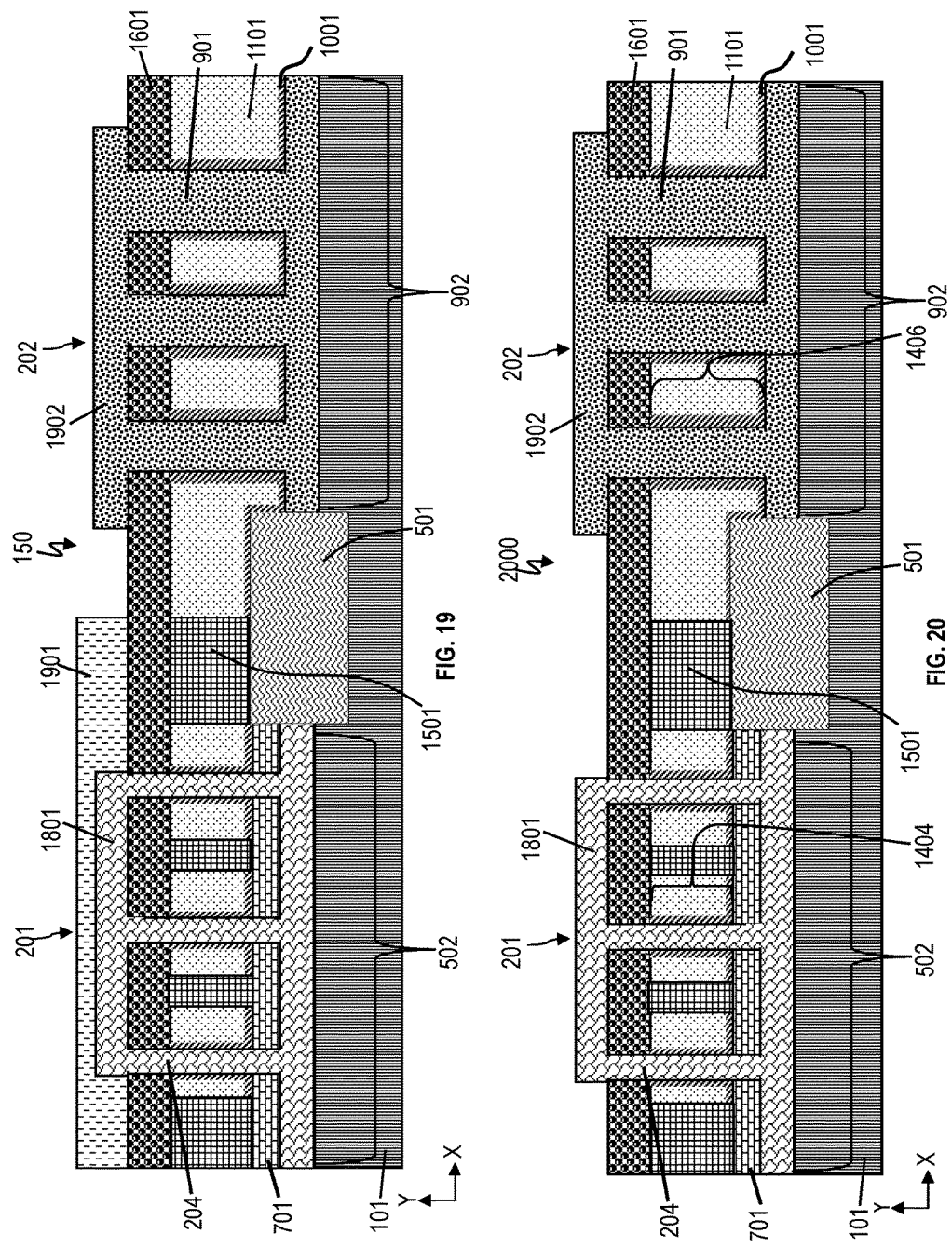

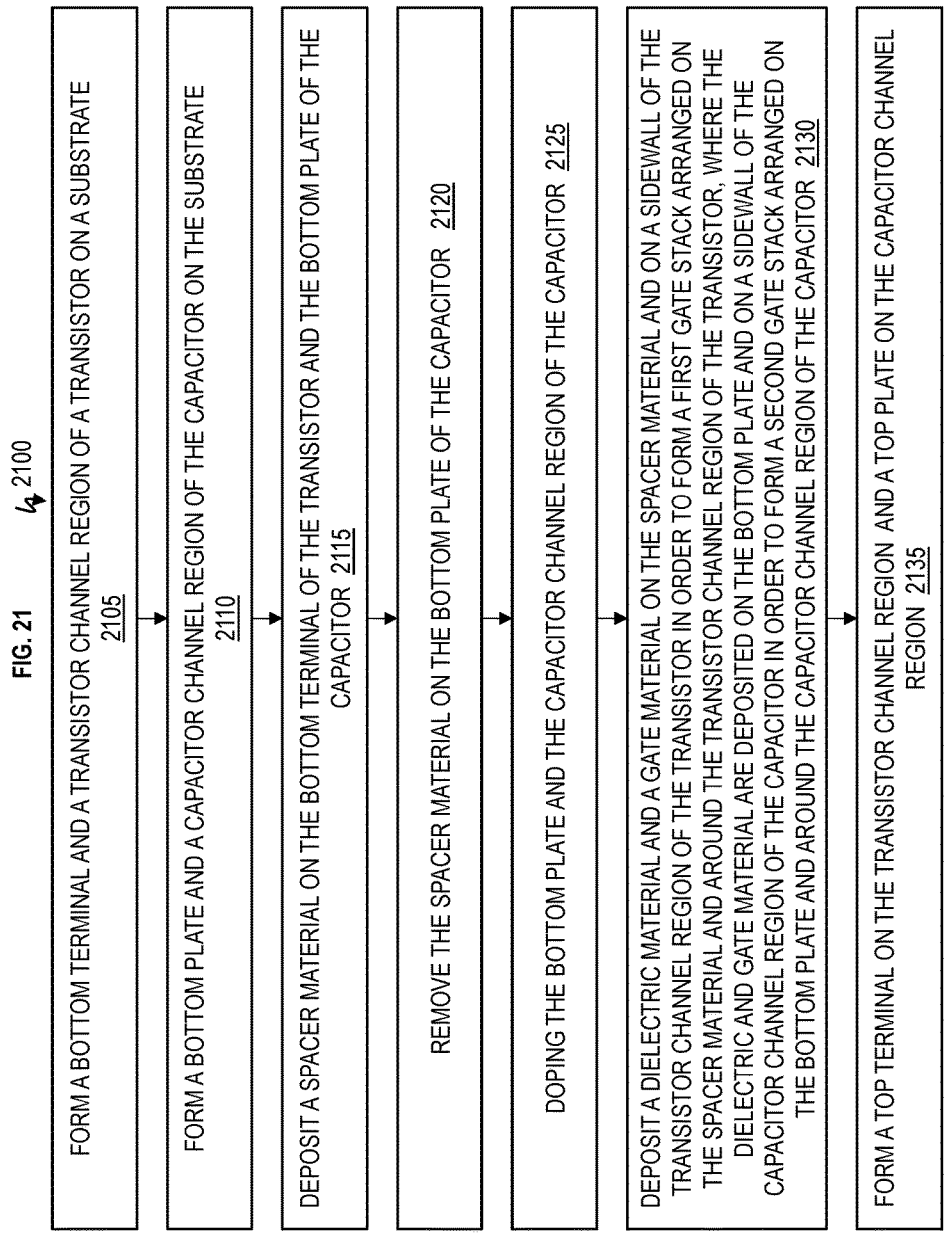

VERTICAL FETS WITH HIGH DENSITY CAPACITOR

PRIORITY

This application is a continuation of U.S. Non-Provisional application Ser. No. 15/096,837, entitled "VERTICAL FETS WITH HIGH DENSITY CAPACITOR", filed Apr. 12, 2016, which is incorporated herein by reference in its entirety.

BACKGROUND

The present invention relates to semiconductor devices, and more specifically, to vertical transistors with high density capacitors.

The field effect transistor (FET) is a transistor that uses an electric field to control the shape and hence the electrical conductivity of a channel of one type of charge carrier in a semiconductor material. An FET's conductivity is regulated by a voltage applied to a terminal (the gate) which is insulated from the device. The applied gate voltage imposes an electric field into the device, which in turn attracts or repels charge carriers to or from the region between a source terminal and a drain terminal. The density of charge carriers in turn influences the conductivity between the source and drain.

A capacitor is a passive two-terminal electrical component used to store electrical energy temporarily in an electric field. The forms of practical capacitors vary widely, but contain at least two electrical conductors (plates) separated by a dielectric (i.e., an insulator that can store energy by becoming polarized). Integrated circuit circuits may include many semiconductor devices. Various processes may be utilized to form transistors and capacitors on an integrated circuit.

SUMMARY

According to an embodiment of the present invention, a semiconductor device is provided. The semiconductor device includes a bottom terminal of a transistor positioned on a substrate, a bottom plate of a capacitor positioned on the substrate, and a spacer arranged on the bottom terminal of the transistor. Also, the semiconductor device includes a transistor channel region extending vertically from the bottom terminal of the transistor through the spacer and in contact with a top terminal of the transistor, and a capacitor channel region extending vertically from the bottom plate of the capacitor and in contact with a top plate of the capacitor. Further, the semiconductor device includes a first gate stack arranged along sidewalls of the transistor channel region and in contact with the spacer, and a second gate stack arranged along sidewalls of the capacitor channel region and disposed on the bottom plate of the capacitor. A distance from a bottom portion of the first gate stack to a top portion of the bottom terminal is greater than a distance from a bottom portion of the second gate stack to a top portion of the bottom plate.

According to another embodiment of the present invention, a semiconductor device is provided. The semiconductor device includes a bottom terminal of a transistor positioned on a substrate, a bottom plate of a capacitor positioned on the substrate, and a spacer positioned on the bottom terminal of the transistor. Also, the semiconductor device includes a transistor channel region extending vertically from the bottom terminal of the transistor through the spacer and in contact with a top terminal, and a capacitor channel region extending vertically from the bottom plate of the capacitor and in contact with a top plate of the capacitor. Further, the semiconductor device includes a first gate stack arranged along sidewalls of the transistor channel region, having a height in a vertical direction and in contact with the spacer, and a second gate stack arranged along sidewalls of the capacitor channel region, having a height in the vertical direction and disposed on the bottom plate of the capacitor. The height of the first gate stack is less than the height of the second gate stack.

According to yet another embodiment of the present invention, a method of forming a capacitor in a vertical transistor device is provided. The method includes forming a bottom terminal and a transistor channel region of a transistor on a substrate, forming a bottom plate and a capacitor channel region of the capacitor on the substrate, and depositing a spacer material on the bottom terminal of the transistor and the bottom plate of the capacitor. Also, the method includes removing the spacer material on the bottom plate of the capacitor, and doping the bottom plate and the capacitor channel region of the capacitor. Further, the method includes depositing a dielectric material and a gate material on the spacer material and on a sidewall of the transistor channel region of the transistor in order to form a first gate stack arranged on the spacer material and around the channel region of the transistor. The dielectric material and the gate material are deposited on the bottom plate and on a sidewall of the capacitor channel region of the capacitor in order to form a second gate stack arranged on the bottom plate and around the capacitor channel region of the capacitor. A top terminal is formed on the transistor channel region, and a top plate is formed on the capacitor channel region.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 1 is a cross-sectional side view of an intermediate structure with a mask layer according to an embodiment.

FIG. 2 is a cross-sectional side view of the intermediate structure after forming the channel regions according to an embodiment.

FIG. 3 is a cross-sectional view of the intermediate structure after depositing a nitride layer according to an embodiment.

FIG. 4 is a cross-sectional side view of the intermediate structure after patterning the nitride layer and recessing the substrate according to an embodiment.

FIG. 5 is a cross-sectional side view of the intermediate structure after depositing a dielectric in the recessed substrate and planarizing to form an isolation region between a transistor area and a capacitor area according to an embodiment.

FIG. 6 is a cross-sectional side view of the intermediate structure after removing the nitride layer according to an embodiment.

FIG. 7 is a cross-sectional side view of the intermediate structure after depositing a spacer material and planarizing according to an embodiment.

FIG. 8 is a cross-sectional side view of the intermediate structure after removing the spacer material to the level of the isolation region according to an embodiment.

FIG. 9A is a cross-sectional side view of the intermediate structure after patterning the spacer material and removing the spacer material in the capacitor area according to an embodiment.

FIG. 10 is a cross-sectional side view of the intermediate structure after depositing a dielectric layer according to an embodiment.

FIG. 13 is a cross-sectional side view of the intermediate structure after recessing the dielectric layer around the channel regions according to an embodiment.

FIG. 14 is cross-sectional side view of the intermediate structure after forming isolation areas between the transistor channel regions according to an embodiment.

FIG. 17 is a cross-sectional side view of the intermediate structure after depositing a mask layer according to an embodiment.

FIG. 18 is a cross-sectional side view of the intermediate structure after forming the source/drain on the transistor according to an embodiment.

FIG. 19 is a cross-sectional side view of the intermediate structure after forming the upper plate on the capacitor according to an embodiment.

FIG. 20 is a cross-sectional side view of a vertical transistor and vertical capacitor after removing the mask according to an embodiment.

FIG. 21 is a flow chart of a method of forming a capacitor in a vertical transistor device according to an embodiment.

DETAILED DESCRIPTION

Figure 9B:
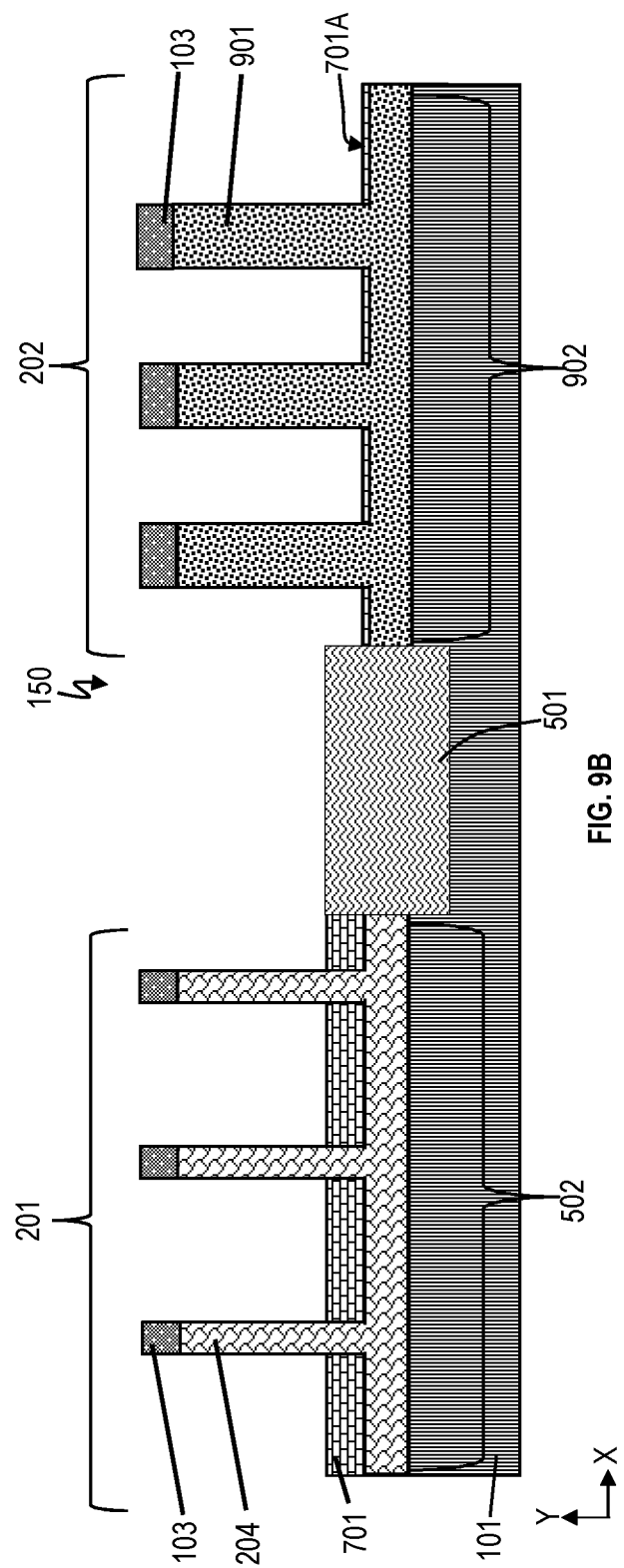
FIG. 9B is a cross-sectional side view of the intermediate structure optionally illustrating a residual spacer material in the capacitor area according to an embodiment.

According to one or more embodiments, described herein is a technique of making a vertical capacitor integrated with the fabrication of a vertical transistor, which produces a high density capacitor. By utilizing a similar production flow but extending the length of the gate (in the y-axis) in the capacitor, one or more high density capacitors are formed during the fabrication process of one or more vertical transistors.

One or more embodiments describe how to add high density capacitors to a vertical field effect transistor semiconductor process. The capacitors have minimal process changes while delivering maximum capacitance with low leakage. Particularly, high density capacitors are required in advanced nodes with minimal additional process complexity, low leakage, and high density.

Turning now to the Figures, FIGS. 1-21 depict a fabrication process of building high capacity vertical capacitors in conjunction with one or more vertical transistors according to embodiments.

FIG. 1 is a cross-sectional side view of an intermediate structure depicting a mask 103 disposed on a semiconductor layer 102 according to an embodiment. The semiconductor layer 102 may be disposed on an oxide 101. In on implementation, the semiconductor layer 102 may include silicon. Other non-limiting examples of semiconductor materials for the semiconductor layer 102 may include SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In one implementation, the oxide 101 comprises silicon dioxide.

It will be seen that the oxide 101 may be utilized as the substrate. While a semiconductor on oxide is shown in the figures it is contemplated that a semiconductor wafer may also be used as the substrate.

FIG. 2 is a cross-sectional side view of the intermediate structure 150 depicting formation of a vertical transistor area and a vertical capacitor area according to an embodiment.

The mask 103 is patterned, and the pattern of the mask 103 is transferred to the semiconductor layer 102. For example, an etch process may be performed to recess the semiconductor layer 102 and form transistor channel regions 204 of a vertical transistor area 201 and form channel region precursors 205 of a vertical capacitor area 202 as shown in FIG. 2. The channel regions 204 of the transistor area 201 are thinner in the x-axis than the channel region precursors 205 of the capacitor area 202. The channel regions 204 of the transistor area 201 can be 20% to 75% thinner than the channel region precursors 205 of the capacitor area 202.

FIG. 3 is a cross-sectional side view of the intermediate structure 150 depicting deposition of a nitride layer 301 according to an embodiment. The nitride layer 301 may be a pad nitride layer and include, for example, silicon nitride. The nitride layer 301 may be deposited by a deposition process, for example, chemical vapor deposition (CVD), liquid phase chemical vapor deposition (LPCVD), or physical vapor deposition (PVD).

FIG. 4 is a cross-sectional side view of the intermediate structure 150 depicting forming an isolation trench 401 according to an embodiment. To form the isolation trench 401, a portion of the semiconductor layer 102 and a portion of the oxide 101 may be removed according to a pattern in the nitride layer 301.

The nitride layer 301 may be patterned by lithography and etching. The pattern from the patterned nitride layer 301 is transferred through the semiconductor layer 102 and into the oxide 101 by performing an etch process to remove the semiconductor layer 102 and recess the oxide 101 in the areas between the patterned nitride 301 layer. Removing the semiconductor 102 layer and recessing the oxide 101 resulting in the isolation trench 401.

The isolation trench 401 is formed between the transistor area 201 and the capacitor area 202. One or more transistors in the transistor area 201 may be an nFET in some embodiments and a pFET in other embodiments.

FIG. 5 is a cross-sectional side view of the intermediate structure 150 depicting deposition of dielectric in the isolation trench 401 to form a shallow trench isolation (STI) region 501 between the transistor area 201 and the capacitor area 202 according to an embodiment. The shallow trench isolation region 501 divides the semiconductor layer 102 into a bottom source/drain 502 (e.g., bottom terminal) for the transistor area 201 and a bottom plate precursor 503 for the capacitor area 202.

In one implementation, the dielectric material in the shallow trench isolation region 501 may be a dielectric oxide, for example, silicon dioxide. Other non-limiting examples of suitable dielectric materials for the isolation regions include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon oxynitride, or any combination thereof.

After depositing the dielectric material within the isolation trench 401 in the semiconductor layer 102 and oxide 101 and on the patterned nitride layer 301, the dielectric is planarized/polished by, for example, chemical mechanical planarization (CMP). Planarization removes excess dielectric from the surface of the nitride layer 301 such that the surface of the shallow trench isolation region 501 is substantially flush with the surface of the nitride layer 301.

FIG. 6 is a cross-sectional side view of the intermediate structure 150 depicting after removing the nitride layer 301 according to an embodiment. The nitride layer 301 may be removed by, for example, a phosphoric acid wet etch. Removal of the nitride layer 301 results in the shallow trench isolation region 501 protruding above the bottom source/drain 502 and the bottom plate precursor 503. The bottom source/drain 502 and the bottom plate precursor 503 are arranged horizontally, which is defined as having a linear dimension in the horizontal direction in the x-axis, which is greater than a linear dimension in the vertical direction in the y-axis.

FIG. 7 is a cross-sectional side view of the intermediate structure 150 depicting after depositing a bottom spacer material 701 and planarizing according to an embodiment. The bottom spacer material 701 is disposed on the transistor area 201, capacitor area 202, and the shallow trench isolation region 501. The bottom spacer material 701 may be a low-k dielectric material. The low-k dielectric material may include Si, N, and C or B. Additionally, the low-k dielectric material may include Si, N, B, and C. For example, the low-k dielectric material may include SiBN, SiCN, SiBCN, or any combination thereof. The bottom spacer material 701 may be deposited by a deposition process, for example, chemical vapor deposition (CVD) or physical vapor deposition (PVD). The bottom spacer material 701 is then planarized by a method such as CMP.

FIG. 8 is a cross-sectional side view of the intermediate structure 150 depicting after selectively etching the bottom spacer material 701 and removing the spacer material so the top surface of the bottom spacer material 701 is coplanar with the shallow trench isolation region 501. The bottom spacer material 701 may be removed by a dry etch process, a wet etch process, or both a dry etch process and a wet etch process. In one implementation, the dry etch process is RIE.

FIG. 9A is a cross-sectional side view of the intermediate structure 150 depicting removal of the bottom spacer material 701 in the capacitor area 202 according to an embodiment.

A mask (not shown) may be deposited on the intermediate structure 150 and patterned. In one implementation, the patterned mask may be utilized to etch the bottom spacer material 701 in the capacitor area 202 while protecting the bottom spacer material 701 in the transistor area 201.

The mask may be, for example, a hard mask material or a resist, such as a polymeric material. Similar to above, the bottom spacer material 701 may be removed by a dry etch process, a wet etch process, or both a dry etch process and a wet etch process. In an exemplary embodiment, the dry etch process is RIE.

While the FIG. 9A shows complete removal of the bottom spacer material 701 in the capacitor area 202, it is also contemplated that the bottom spacer material can be reduced in thickness to bottom space material 701A but not completely removed in one implementation, as shown in FIG. 9B.

After the bottom spacer material 701 is removed in the capacitor area 202, the semiconductor layer 102 in the capacitor area 202 is doped resulting in the doped bottom plate 902 and doped channel regions 901. Doping can be achieved by any suitable process such as, for example, an ion implantation and annealing process. In one implementation, the channel regions 204 in transistor area 201 may be lightly doped but the channel regions 204 are not doped to the same extent as the semiconductor material in the doped bottom plate 902 and doped capacitor channel regions 901 in the capacitor area 202. As arranged in the figure, the bottom plate 902 and the bottom source/drain 502 have a width in the horizontal direction in the x-axis and a height in the vertical direction in the y-axis. As used herein, "arranged horizontally" is defined as having a width greater than the height.

FIG. 10 is a cross-sectional side view of the intermediate structure 150 depicting conformally depositing a dielectric material 1001 on the transistor area 201, the capacitor area 202, and the shallow trench isolation region 501 according to an embodiment. The dielectric material 1001 may be a high-k dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The dielectric material 1001 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of materials used.

Figure 11:
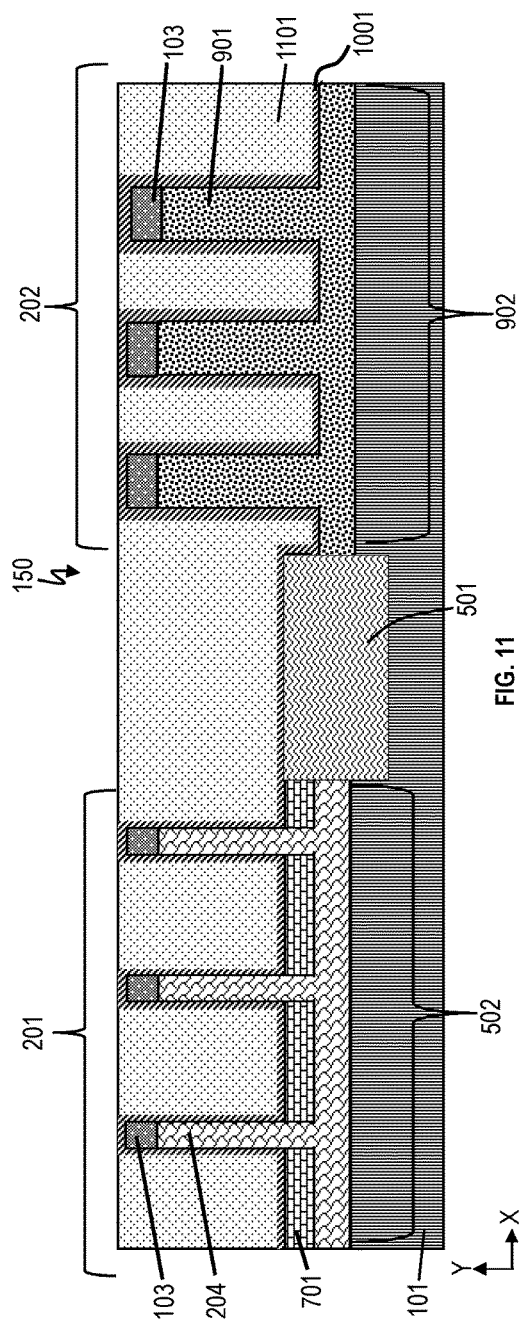
FIG. 11 is a cross-sectional side view of the intermediate structure after depositing a gate metal stack and planarizing according to an embodiment.

FIG. 11 is a cross-sectional side view of the intermediate structure 150 depicting deposition of a gate material 1101 on the transistor area 201, shallow trench isolation region 501, and the capacitor 202 area. While shown as a single material for simplicity, a person of ordinary skill in the art will recognize that the gate material 1101 may comprise a plurality of layers including, but not limited to, a work function metal layer and a gate metal layer. This plurality of layers may typically be deposited in a conformal manner.

The type of work function metal(s) depends on the type of transistor and may differ between the transistor 201 and the capacitor 202. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate metal comprises a conductive metal. Non-limiting examples of suitable conductive metals may include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

In some embodiments, an oxide may be deposited and patterned to form a side-by-side gate contact or other configuration depending on the orientation of the gates in the devices (not shown). Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 12:
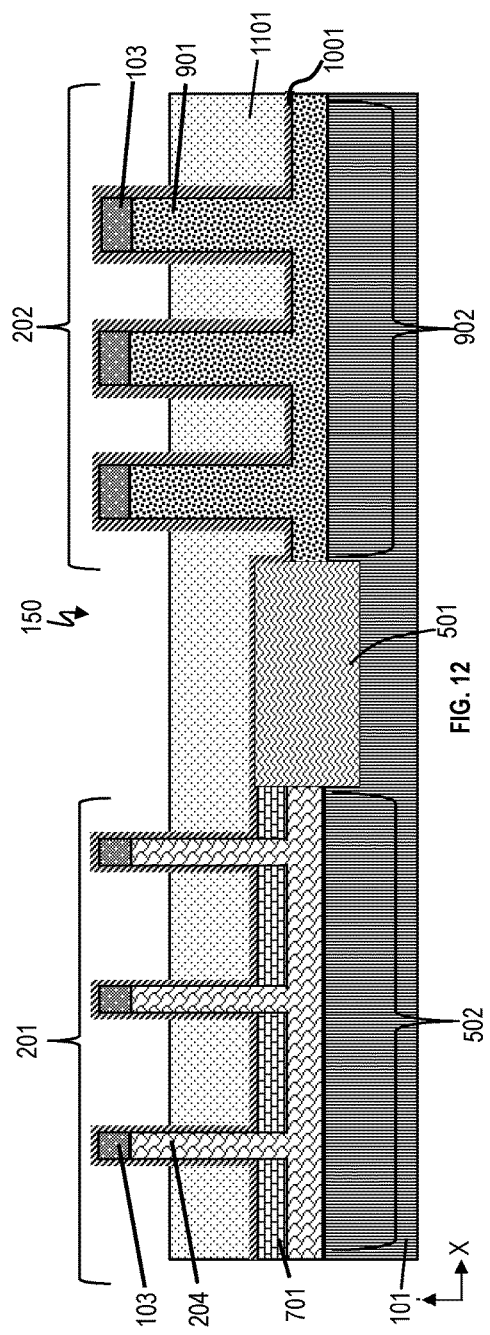
FIG. 12 is a cross-sectional side view of the intermediate structure recessing the gate metal stack according to an embodiment.

FIG. 12 is a cross-sectional side view of the intermediate structure 150 depicting recessing the gate material 1101 below the mask 103 on the channel regions 204 of the transistor area 201 and the channel regions 901 of the capacitor area 202. The gate material 1101 may be recessed by, for example, a reactive ion etch (RIE) or a wet etch. The gate material 1101 may be recessed by about 10 nanometers (nm) to about 100 nm. The gate material 1101 is protected by the oxide in the gate contact area (not shown) and will not be recessed. One skilled in the art understands that a vertical transistor has a gate contact area in which the gate contact is formed, such that gate voltage can be applied to the gate contact for transistor operation.

FIG. 13 is a cross-sectional side view of the intermediate structure 150 depicting recessing the dielectric material 1001 around the exposed channel regions 204 in the transistor area 201 and the exposed channel regions 901 in the capacitor area 202 according to an embodiment. The dielectric material 1001 is recessed to the surface of the gate material 1101 to expose the mask 103 and the sidewalls of the channel regions 204 and 901. The dielectric material 1001 may be recessed by, for example, a wet etch that is selective to the dielectric material 1001 over the gate material 1101. As noted above, the gate material 1101 may include more than one material and/or layer.

FIG. 14 is a cross-sectional side view of the intermediate structure 150 depicting depositing another mask 1401 on the exposed mask 103 and exposed channel regions 204 and 901 of the transistor area 201 and the capacitor area 202 according to an embodiment. The mask 1401 is patterned. The patterned of the mask 1401 is transferred to the gate material 1101 and dielectric material 1001 to form gate stacks 1404 in the transistor area 201 and gate stacks 1406 in the capacitor area 202. The gate stacks 1406 have a taller height in the y-axis than the gate stacks 1404 because the bottom spacer material 701 has been removed from the capacitor area 202. The gate stacks 1404, 1406 include the gate material 1101 and dielectric material 1001. In the transistor area 201, the gate stacks 1404 extend from the top surface of the bottom spacer material 701 to the top (coplanar) surfaces of the gate material 1101 and dielectric material 1001. In the capacitor area 202, the gate stacks 1406 extend from the top surface of the doped bottom plate 902 to the top (coplanar) surfaces of the gate material 1101 and dielectric material 1001.

The other mask 1401 may be, for example, silicon nitride, silicon dioxide, a metallic oxide (e.g., hafnium dioxide), or a metallic nitride (e.g., titanium nitride, tantalum nitride), which can be deposited by, for example, low pressure chemical vapor deposition (LPCVD) or atomic layer deposition (ALD). Recesses 1402 are formed between the gate material 1101 and dielectric material 1001 arranged on sidewalls of the transistor channel regions 204, and as a result, gate stacks 1404 are formed on sidewalls of the transistor channel regions 204 over the bottom spacer material 701. A recess 1403 is also formed over at least a portion of the shallow trench isolation region 501.

Figure 15:
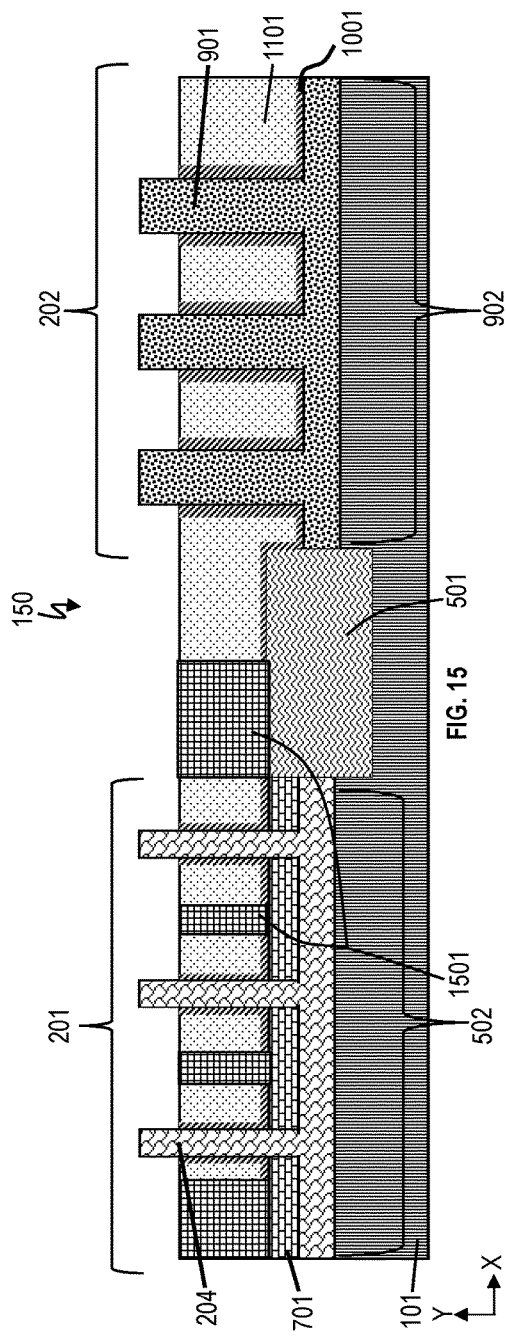
FIG. 15 is a cross-sectional side view of the intermediate structure after depositing a dielectric material in the isolation areas between the transistor channel regions according to an embodiment.

FIG. 15 is a cross-sectional side view of the intermediate structure 150 depicting depositing another dielectric material 1501 in the recesses 1402 formed between the gate stacks 1404 arranged on sidewalls of the transistor channel regions as well as in the recess 1403 formed over at least a portion of the shallow trench isolation region 501 according to an embodiment. The mask 1401 and the mask 103 are removed. The other dielectric material 1501 may be a high-k dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

Figure 16:
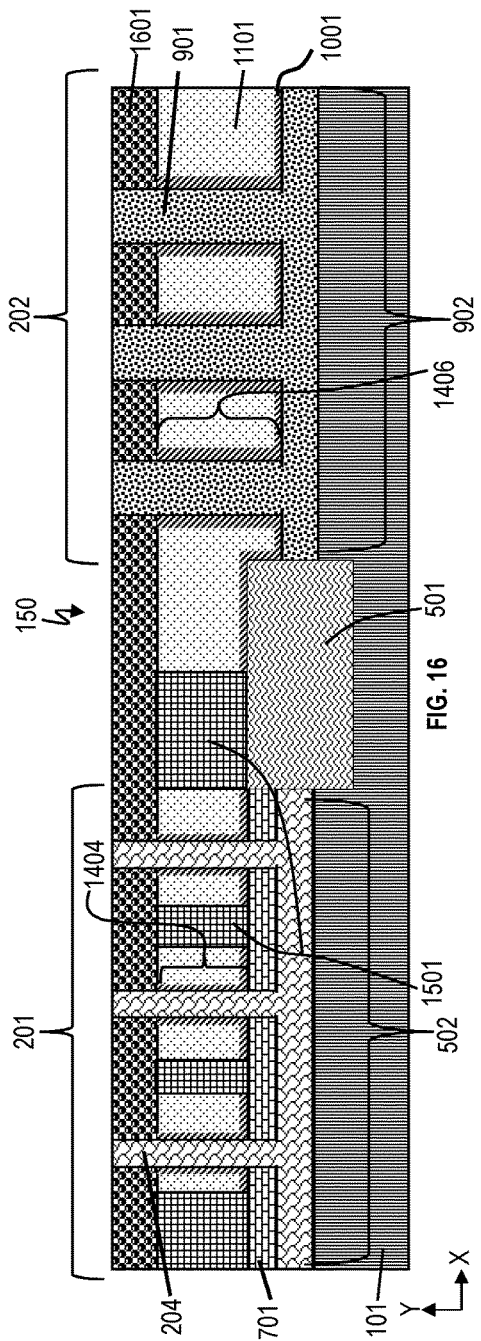
FIG. 16 is a cross-sectional side view of the intermediate structure after depositing a top spacer material according to an embodiment.

FIG. 16 is a cross-sectional side view of the intermediate structure 150 depicting depositing a top spacer layer 1601 on the gate stacks 1404, 1406, the dielectric material 1001, exposed channel regions 204 and 901, the dielectric material 1501 according to an embodiment. The top spacer layer 1601 is planarized. The top spacer layer 1601 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The top spacer layer 1601 may be deposited by a deposition process, including, but not limited to CVD, PVD, plasma enhanced CVD, atomic layer deposition (ALD), evaporation, chemical solution deposition, or like processes. After deposition, the top spacer 1601 may be polished by CMP down to the surface of the transistor and capacitor channel regions 204 and 901.

FIG. 17 is a cross-sectional side view of the intermediate structure 150 depicting deposition of a hard mask 1701 on the top spacer 1601. Non-limiting examples of suitable materials for the hard mask 1701 may include silicon oxide, silicon nitride, or any combination thereof.

FIG. 18 is a cross-sectional side view of the intermediate structure 150 depicting formation of a top source/drain 1801 (e.g., top terminal) according to an embodiment. FIG. 18 illustrates patterning the hard mask 1701 over the transistor channel regions 204 of the transistor area 201 in order to form the top source/drain 1801. The hard mask 1701 is patterned (removed) over the transistor area 201 while the hard mask 1701 remains over the capacitor area 202 to protect the capacitor area 202. As such, the tops of the transistor channel regions 204 are exposed.

The top source/drain 1801 over the transistor channel region 204 is formed. The top source/drain 1801 may be formed by an epitaxial growth process. The source/drain 1801 includes an epitaxial layer/growth extending from the tops of transistor channel regions 204.

Suitable epitaxial growth processes include, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The top source/drain 1801 may include, for example, silicon, germanium, or silicon germanium. A number of different sources may be used for the deposition of the epitaxial layers. In some embodiments, the gas source for the deposition of epitaxial semiconductor material include a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 19 is a cross-sectional side view of the intermediate structure 150 depicting formation of a top plate 1902 according to an embodiment. FIG. 19 illustrates removing the hard mask 1701, depositing another hard mask 1901, and patterning (removing) the hard mask 1901 over the capacitor channel regions 901. The hard mask 1901 is removed over the capacitor area 202 while the hard mask 1901 remains over the transistor area 201 to protect the transistor area 201. As such, the tops of the capacitor channel regions 901 are exposed.

The top plate 1902 is formed over the capacitor channel regions 901. The top plate 1902 may include an epitaxial growth or layer as analogously described above for the top source/drain 1801 in FIG. 18. The top plate 1902 is then doped using techniques as analogously described above for top source/drain 1801.

FIG. 20 is a cross-sectional side view of a structure 2000 after the hard mask 1901 has been removed according to an embodiment. In FIG. 20, the transistor area 201 may be a single transistor in an implementation, and the capacitor area 202 may be a single capacitor in an implementation. In another implementation, 3 transistors may be individually formed by the 3 transistor channel regions 204 in the transistor area 201, for example, when the top source/drain 1801 is separated into 3 sources/drains over the 3 transistor channel regions 204. In one implementation, 3 capacitors may be individually by the 3 capacitor channel regions 901 formed in the capacitor area 202, for example, when the top plate 1902 is separated into 3 top plates over the 3 transistor channel regions 204.

It should be appreciated that further metallization processing such as middle-of-the-line (MOL) processing and/or back-end-of-the-line processing may be performed. For example, after forming the top source/drain 1801 and the top plate 1902 and after removing the hard mask 1901, another layer of top spacer (not shown) is deposited. Source contacts, drain contacts, and gate contacts may be formed from the source, drain, and gate by forming trenches through the top spacer to the source/drain or gate and filling with one or more conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering.

FIG. 21 is a flow chart of a method 2100 of forming a capacitor in a vertical transistor device according to an embodiment. Reference can be made to FIGS. 1-20.

At block 2105, a bottom terminal (e.g., bottom source/drain 502) and a transistor channel region 204 of a transistor (in transistor area 201) are formed on a substrate (e.g., oxide 101).

At block 2110, a bottom plate 503 and a capacitor channel region 901 of the capacitor are formed on the substrate (e.g., oxide 101).

At block 2115, a spacer material 701 is deposited on the bottom terminal 502 of the transistor and the bottom plate 503 of the capacitor.

At block 2120, the spacer material 701 on the bottom plate 503 of the capacitor is removed.

At block 2125, the bottom plate 902 and the capacitor channel region 901 of the capacitor are doped.

At block 2130, a dielectric material 1001 and a gate material 1101 are deposited on the spacer material 701 and on a sidewall of the transistor channel region 204 of the transistor in order to form a first gate stack 1404 arranged on the spacer material 701 and around the transistor channel region 204 of the transistor. The dielectric material 1001 and the gate material 1101 are deposited on the bottom plate 902 and on a sidewall of the capacitor channel region 901 of the capacitor in order to form a second gate stack 1406 arranged on the (doped) bottom plate 902 and around the (doped) capacitor channel region 901 of the capacitor.

At block 2135, a top terminal (top source/drain 1801) is formed on the transistor channel region 204 and a top plate 1902 is formed on the capacitor channel region 901. In the transistor area 201, a vertical transistor is formed by at least one transistor channel region 204, the gate stack 1404 of the dielectric material 1001 and gate material 1101, the bottom terminal (i.e., bottom source/drain 502), and top terminal (i.e., top source/drain 1801). In the capacitor area 202, a vertical capacitor is formed by at least one capacitor channel region 901, the gate stack 1406 of the dielectric material 1001 and gate material 1101, the bottom plate 902, and top plate 1902.

The first gate stack 1404 around the transistor channel region 204 of the transistor is shorter than the second gate stack 1406 around the capacitor channel region 901 of the capacitor. A top portion/surface of the first gate stack 1404 is coplanar with a top portion/surface of the second gate stack 1406. A distance from a bottom portion/surface of the first gate stack 1404 to a top portion/surface of the bottom terminal 502 is greater than a distance from a bottom portion/surface of the second gate stack 1406 to a top portion/surface of the bottom plate 902.

The second gate stack 1406 includes a dielectric material 1001 and the dielectric material is disposed on the bottom plate 902 of the capacitor. A residual spacer 701A of the spacer 701 in contact with the bottom plate 902 of the capacitor, where the residual spacer 701 on the bottom plate 902 of the capacitor has a thickness less than a thickness of the spacer 701 on the bottom terminal 502 of the transistor.

The first gate stack 1404 is shorter than the second gate stack 1406. A top portion of the first gate stack 1404 is substantially coplanar with a top portion of the second gate stack 1406.

The transistor channel region 204 is thinner (in the x-axis) than the capacitor channel region 901 of the capacitor. The capacitor channel region 901 of the capacitor is heavily doped and the transistor channel region 204 of the transistor is lightly doped.

The first gate stack 1404 includes a first dielectric material 1001 and a first gate material 1101 disposed on the first dielectric material 1001. The second gate stack 1406 includes a second dielectric material 1001 and a second gate material 1101 disposed on the second dielectric material 1001. The first dielectric material and the second dielectric material are the same material and have substantially a same thickness.

Technical effects and benefits include improved semiconductor devices, such as, e.g., integrated circuits, on a wafer. The technical effects further include removal of the bottom spacer material 701 in the capacitor area 202 which allows for the formation of gate material 1101 (including gate stack 1406) in the capacitor area 202 that has a height greater than the height of the gate 1101 (including gate stack 1404) in the transistor area 201; all of this is while the top of the gate 1101 (including gate stack 1406) in the capacitor area 202 is coplanar with the top of the gate 1101 (gate stack 1404) in the transistor area 201. Gate height in the capacitor area 202, is defined as the distance from the bottom plate 902 to the top spacer 1601. Gate height in the transistor area 201 is defined as the distance from the bottom spacer 701 to the top spacer 1601. In one or more embodiments, the height of the (capacitor) gate material 1101 (or gate stack 1406) in the capacitor area 202 is 20% to 100% greater than the height of the (transistor) gate material 1101 (or gate stack 1404) in the transistor area 201.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a transistor extending vertically from a substrate, the transistor comprising a bottom terminal positioned on the substrate, at least one vertical transistor channel region on the bottom terminal, a first gate stack on sides of the at least one vertical transistor channel region, and a top terminal above the at least one vertical transistor channel region, wherein an entirety of the first gate stack is below a top of the at least one vertical transistor channel region in a vertical direction;
   a capacitor extending vertically from the substrate, the capacitor comprising a bottom plate positioned on the substrate, at least one vertical capacitor channel region on the bottom plate, a second gate stack on sides of the at least one vertical capacitor channel region, and a top plate above the at least one vertical capacitor channel region; and
   an isolation region formed in a portion of the substrate such that the isolation region separates the bottom terminal of the transistor from the bottom plate of the capacitor.

2. The device of claim 1, wherein a spacer is arranged on the bottom terminal of the transistor.

3. The device of claim 1, wherein the first gate stack includes a dielectric material.

4. The device of claim 1, wherein the second gate stack includes a dielectric material.

5. The device of claim 1, wherein the transistor channel region of the transistor is doped.

6. The device of claim 1, wherein the transistor channel region is a semiconductor material.

7. The device of claim 1, wherein the capacitor channel region of the capacitor is doped.

8. The device of claim 1, wherein the capacitor channel region is a semiconductor material.

9. The device of claim 1, wherein the bottom terminal is a semiconductor material.

10. The device of claim 1, wherein the top terminal is a semiconductor material.

11. The device of claim 1, wherein the bottom plate is a semiconductor material.

12. The device of claim 1, wherein the top plate is a semiconductor material.

13. A method of forming a semiconductor device comprising:
   providing a transistor extending vertically from a substrate, the transistor comprising a bottom terminal positioned on the substrate, at least one vertical transistor channel region on the bottom terminal, a first gate stack on sides of the at least one vertical transistor channel region, and a top terminal above the at least one vertical transistor channel region, wherein an entirety of the first gate stack is below a top of the at least one vertical transistor channel region in a vertical direction;

providing a capacitor extending vertically from the substrate, the capacitor comprising a bottom plate positioned on the substrate, at least one vertical capacitor channel region on the bottom plate, a second gate stack on sides of the at least one vertical capacitor channel region, and a top plate above the at least one vertical capacitor channel region; and forming an isolation region in a portion of the substrate such that the isolation region separates the bottom terminal of the transistor from the bottom plate of the capacitor.

14. The method of claim 13, wherein a spacer is arranged on the bottom terminal of the transistor.

15. The method of claim 13, wherein the first gate stack includes a dielectric material.

16. The method of claim 13, wherein the second gate stack includes a dielectric material.

17. The device of claim 1, further comprising a top spacer directly on top of the first gate stack of the transistor, directly on top of the second gate stack of the capacitor, and over the isolation region separating the bottom terminal and the bottom plate.

* * * * *